(12) United States Patent
Yildirim et al.

(10) Patent No.: US 9,496,012 B2
(45) Date of Patent: Nov. 15, 2016

(54) METHOD AND APPARATUS FOR REFERENCE VOLTAGE CALIBRATION IN A SINGLE-ENDED RECEIVER

(71) Applicant: Cavium, Inc., San Jose, CA (US)

(72) Inventors: Omer O. Yildirim, Marlborough, MA (US); David Lin, Westborough, MA (US); Scott E. Meninger, Groton, MA (US)

(73) Assignee: Cavium, Inc., San Jose, CA (US)

( * ) Notice: Subject to any disclaimer, the term of this patent is extended or adjusted under 35 U.S.C. 154(b) by 0 days.

(21) Appl. No.: 14/040,532

(22) Filed: Sep. 27, 2013

(65) Prior Publication Data

US 2015/0091631 A1 Apr. 2, 2015

(51) Int. Cl.
*H03L 5/00* (2006.01)
*G11C 7/14* (2006.01)
*G11C 29/02* (2006.01)

(52) U.S. Cl.
CPC ............... *G11C 7/14* (2013.01); *G11C 29/022* (2013.01); *G11C 29/028* (2013.01)

(58) Field of Classification Search
CPC .................. H03K 19/00384; H04L 25/03057; G05F 1/46
USPC .......... 327/332–333, 334–364; 375/229–236
See application file for complete search history.

(56) References Cited

U.S. PATENT DOCUMENTS

| | | | |
|---|---|---|---|
| 4,050,030 A | 9/1977 | Russell | |
| 5,237,533 A | 8/1993 | Papaliolios | |
| 6,316,992 B1 | 11/2001 | Miao et al. | |
| 6,807,118 B2 | 10/2004 | Perner | |
| 7,576,609 B1* | 8/2009 | Huang | H03F 3/3022 330/255 |
| 7,603,084 B2 | 10/2009 | Aytur | |
| 7,755,421 B2 | 7/2010 | Chen et al. | |
| 7,768,298 B2* | 8/2010 | Park | H03K 19/017545 326/30 |

(Continued)

OTHER PUBLICATIONS

Hyung-Joon Chi et. al. "A 3.2Gb/s 8b Single-Ended Integrating DFE RX for 2-Drop DRAM Interface with Internal Reference Voltage and Digital Calibration" Solid-State circuits Conference,Feb 3-7, 2008, ISSCC 2008 Digest of Technical Papers. IEEE International. pp. 112-600.*

(Continued)

*Primary Examiner* — Lincoln Donovan
*Assistant Examiner* — Metasebia Retebo
(74) *Attorney, Agent, or Firm* — Hamilton, Brook, Smith & Reynolds, P.C.

(57) ABSTRACT

According to at least one example embodiment, a method and corresponding system, or circuit, for calibrating a reference voltage of a single-ended receiver, include applying a clock signal and a reference voltage signal as inputs to the differential amplifier of the single-ended receiver. The differential amplifier provides an output signal, the output signal is processed, and an indication of a duty cycle associated with an output signal of the amplifier is evaluated. Based on the evaluated indication of the duty cycle, a control logic module, or circuit, adjusts a level of the reference voltage signal. The process of evaluating the indication of the duty cycle and adjusting the reference voltage level is repeated for a number of iterations.

22 Claims, 9 Drawing Sheets

(56) References Cited

U.S. PATENT DOCUMENTS

| | | | |
|---|---|---|---|
| 7,817,714 B2* | 10/2010 | Bae | H04L 25/03057 |
| | | | 375/229 |
| 8,391,417 B2 | 3/2013 | Asada et al. | |
| 9,087,567 B2 | 7/2015 | Yildirim et al. | |
| 2006/0274837 A1 | 12/2006 | Doi et al. | |
| 2007/0200619 A1 | 8/2007 | Jang | |
| 2008/0252504 A1 | 10/2008 | Jeong et al. | |
| 2010/0315142 A1* | 12/2010 | Zerbe | H04L 7/0337 |
| | | | 327/161 |
| 2012/0032722 A1 | 2/2012 | Mulder | |
| 2012/0086494 A1 | 4/2012 | Asada et al. | |
| 2012/0268181 A1* | 10/2012 | Fujimaki | H03L 7/10 |
| | | | 327/158 |
| 2012/0299653 A1 | 11/2012 | Scott et al. | |
| 2015/0092510 A1 | 4/2015 | Yildirim et al. | |
| 2015/0092889 A1 | 4/2015 | Yildirim et al. | |

OTHER PUBLICATIONS

*Non Final Office Action dated Dec. 15, 2014 Issued in U.S. Appl. No. 14/040,563.
*Non Final Office Action dated Jan. 28, 2015 Issued in U.S. Appl. No. 14/040,577.
Final Office Action dated Sep. 24, 2015 Issued in U.S. Appl. No. 14/040,577.
Notice of Allowance mailed Apr. 11, 2016 in U.S. Appl. No. 14/040,577.

* cited by examiner

METHOD AND APPARATUS FOR REFERENCE VOLTAGE CALIBRATION IN A SINGLE-ENDED RECEIVER

BACKGROUND

Many memory interfaces employ single-ended receivers to receive data from a corresponding memory or other memory interfaces. A single-ended receiver typically includes a differential amplifier having a reference DC voltage and a data signal usually applied as inputs.

SUMMARY

Single-ended receivers are often used in memory interfaces. In a single-ended receiver, a reference DC voltage and a data signal are usually applied as inputs to a differential amplifier of the single-ended receiver. A shift, or a bias, in the reference DC voltage may result in degradation of the performance of the single-ended receiver and a corresponding memory interface.

According to at least one example embodiment, a method and corresponding system, or circuit, for calibrating a reference voltage of a single-ended receiver, include applying a clock signal and a reference voltage signal as inputs to the differential amplifier of the single-ended receiver. In response, the differential amplifier provides an output signal. The output signal is processed and an indication of a duty cycle associated with an output signal of the amplifier is evaluated. Based on the evaluated indication of the duty cycle, a control logic module, or circuit, adjusts a level of the reference voltage signal. The process of evaluating the indication of the duty cycle and adjusting the reference voltage level is repeated for a number of iterations. The final level of the reference voltage signal achieved at the final iteration may then be employed to the single-ended receiver during a data reception phase.

In evaluating the indication of the duty cycle, the output signal of the differential amplifier may be split into two separate output signals, each of the two output signals is integrated over a time interval resulting in two integration values, and the two integration values are then compared. The two separate output signals represent, respectively, the high-voltage pulses and the low-voltage pulses in the amplifier's output signal. The time interval over which the two separate output signals are integrated is equal to the duration of multiple clock cycles of the clock signal.

Alternatively, evaluating the indication of the duty cycle is achieved by integrating the output of the amplifier over a time interval resulting in an integration value, and comparing the integration value to a reference duty cycle value. The time interval over which the two separate output signals are integrated is equal to the duration of multiple clock cycles of the clock signal.

In adjusting the level of the reference voltage signal, the control logic is configured to set a digital-to-analog (DA) converter that converts a digital value into an analog signal and provides the analog signal as the reference voltage signal to the amplifier. Specifically, the control logic sets or updates the digital value and sends it to the DAC. The digital value voltage provided by the control logic to the DA converter is a multiple bit value. The number of iterations is equal to the number of bits representing the digital value minus one.

According to at least one example embodiment, the single-ended receiver is part of an input interface having multiple single-ended receivers. As such, the iterative reference voltage calibration is applied to at least one of the multiple single-ended receivers. The final reference voltage value may then be applied to all single-ended receivers of the input interface. The input interface may be a memory interface or a component of a memory interface. The memory interface may be, for example, a double data rate 2 (DDR2) memory interface, double data rate 3 (DDR3) memory interface, double data rate 4 (DDR4) memory interface, low power double data rate 2 (LP DDR2) memory interface, low power double data rate 3 (LP DDR3) memory interface, low power double data rate 4 (LP DDR4) memory interface, graphical double data rate 3 (GDDR3) memory interface, graphical double data rate 4 (GDDR4) memory interface, graphical double data rate 5 (GDDR5) memory interface, wide input/output (Wide I/O) memory interface, or wide input/output 2 (Wide I/O 2) memory interface.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

One of the commonly performed operations by a microprocessor is memory access. While microprocessors are getting faster and faster, latency associated with memory access usually results into a performance bottleneck. In fact, memory bottleneck represents a real challenge with respect to improving the performance of a processing system. One way to reduce latency associated with memory access operations is to enhance performance and accuracy of the memory interface associated with the accessed memory.

Many memory interfaces make use of single-ended receivers. Examples of such memory interfaces include double data rate 2 (DDR2) interface, DDR3 interface, DDR4 interface, low power double data rate 2 (LPDDR2) interface, LPDDR3 interface, LPDDR4 interface, graphical double data rate 3 (GDDR3) interface, GDDR4 interface, GDDR5 interface, wide input/output (Wide I/O) interface, and Wide I/O 2 interface.

Figure 1:
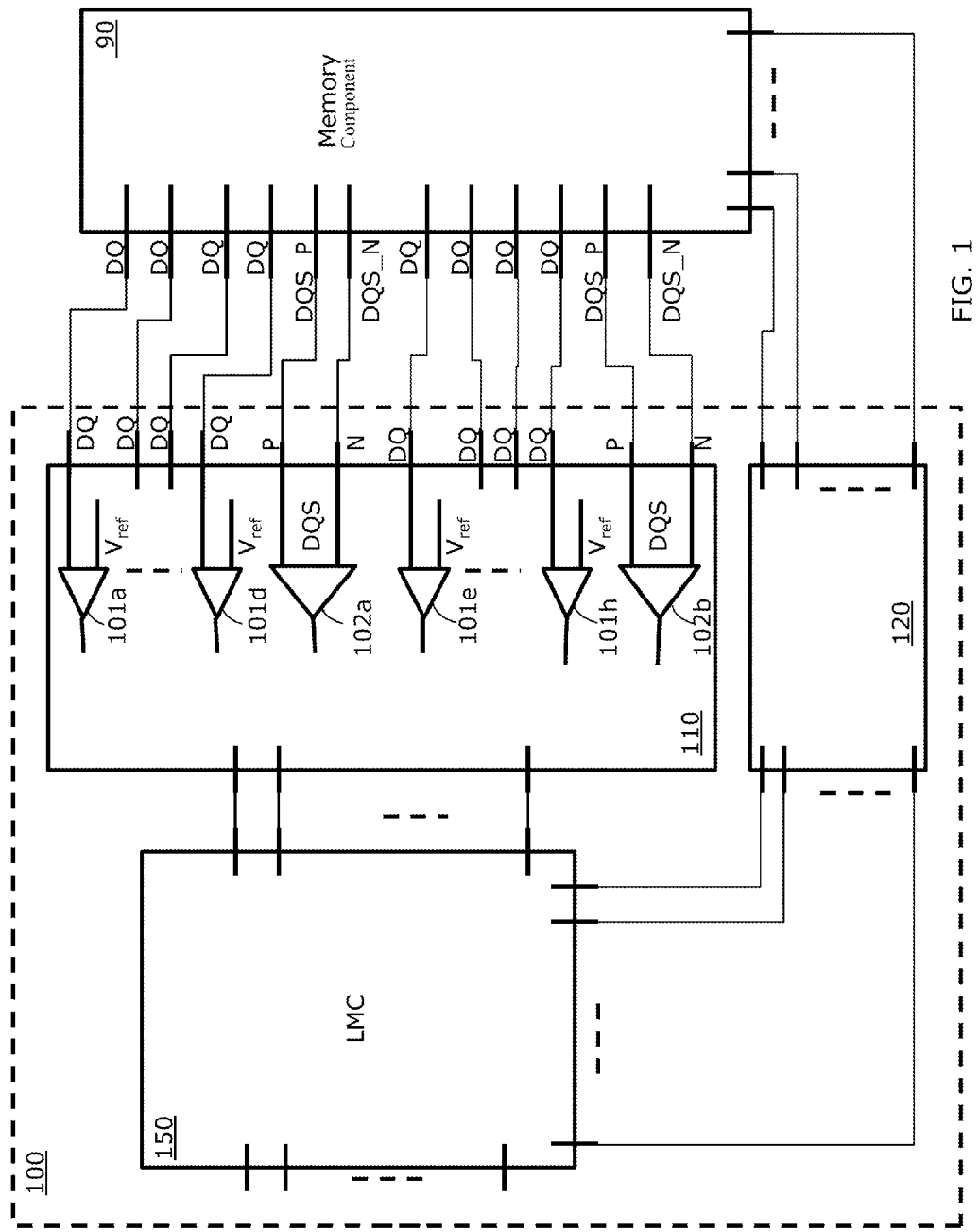
FIG. 1 is a diagram illustrating an overview of a memory system, according to at least one example embodiment.

FIG. 1 is a diagram illustrating an overview of a memory system according to at least one example embodiment. The memory system includes a memory controller device 100 and a memory component 90. The memory controller device is typically implemented within a microprocessor. In response to a read operation, the memory component 90 outputs eight data signals, also referred to as DQ signals, representing eight bits of a data byte, and at least one pair of data strobe signals, also referred to as DQS signals. In the example shown in FIG. 1, each four DQ signals are associated with a corresponding DQS signal. The memory controller device 100 includes a bidirectional input/output memory interface 110, a unidirectional command interface 120, and a local memory controller LMC 150. The command interface is an output-only interface for sending commands from the LMC 150 to the memory component 90. The input/output memory interface 110 is a bidirectional I/O interface for sending data, in both directions, between the memory component 90 and the LMC 150. The I/O interface 110 includes eight single-ended receivers, each having a differential amplifier, e.g., 101a-101h. For the sake of simplicity, the single-ended receivers 101a-101h are shown with respect to one direction of data transfer between the memory component 90 and the LMC 150. For each of the differential amplifiers 101a-101h, associated with the single-ended receivers, the corresponding inputs include a reference voltage ($V_{ref}$) and one of the DQ signals, e.g., provided by the memory component 90. The I/O memory interface 110 also includes at least one other differential amplifier, e.g., 102a and 102b. Each of the differential amplifiers 102a and 102b is coupled to one pair of DQS signals as inputs. Output of the I/O memory interface 110 is provided to a microprocessor, e.g., to a level-2 cache (L2C) of the microprocessor, through the local memory controller 150. The output-only command interface 120, receives input signals from the local memory controller 150 and provides corresponding output signals to the memory component 90.

Figure 2B:
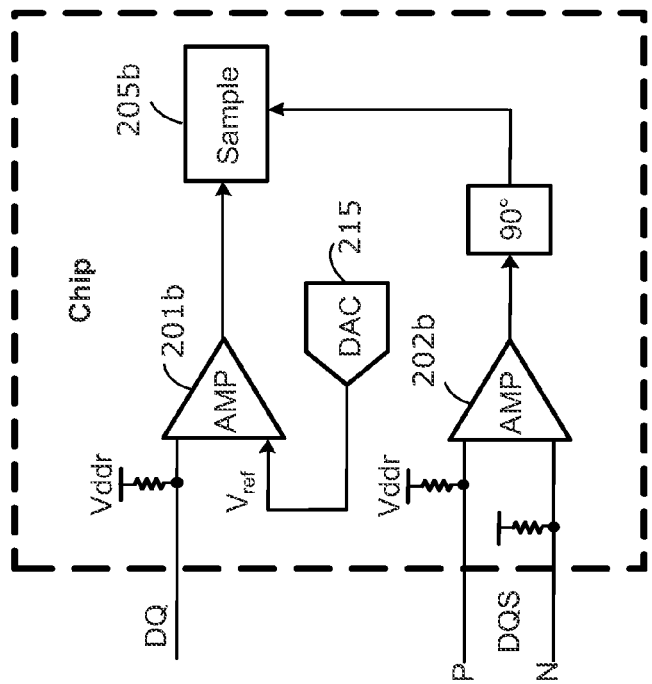
FIGS. 2A and 2B are block diagrams illustrating single-ended receivers associated, respectively, with DDR3 and DDR4 memory interfaces, according to at least one example embodiment.
Figure 2A:
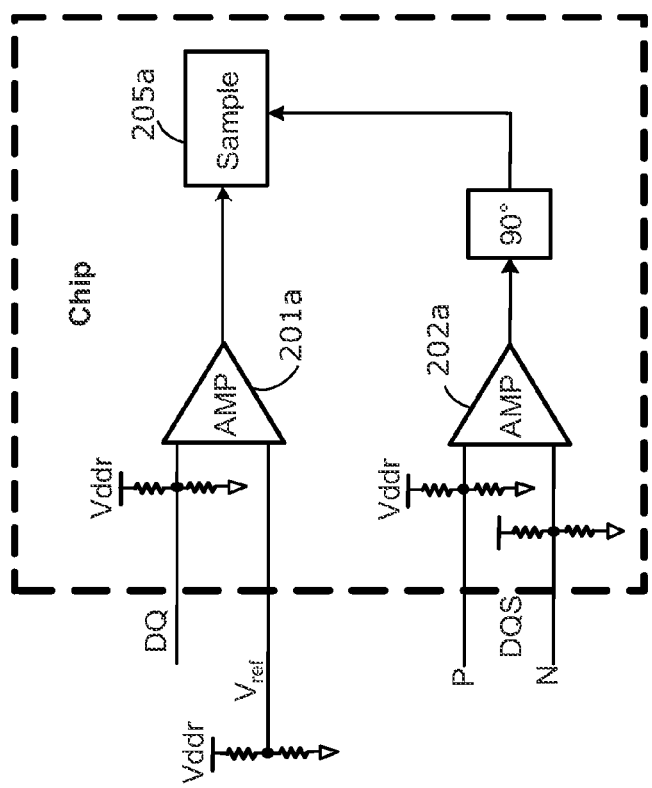

FIGS. 2A and 2B are block diagrams illustrating single-ended receivers associated, respectively, with DDR3 and DDR4 memory interfaces, according to at least one example embodiment. In the DDR3 memory interface shown in FIG. 2A, each input node of a differential amplifier 201a of the single-ended receiver is coupled to two resistors. Also, each input node of a differential amplifier 202a, receiving a pair of DQS signals, is coupled to two resistors. The output of the differential amplifier 202a is shifted by 90 degrees. The shifted output of the differential amplifier 202a and the output of the differential amplifier 201a are provided to a sampler 205a. The sampler 205a is configured to sample the output of the differential amplifier 201a based on the shifted output of the differential amplifier 202a. The output of the sampler 205a is provided to the local memory controller 150.

In the DDR4 memory interface shown in FIG. 2B, the DQ input node of a differential amplifier 201b of the single-ended receiver is coupled to a single resistor. Also, the DQS_P input node of a differential amplifier 202b, receiving a DQS_P signal, is coupled to a single resistor. The reference voltage input to the differential amplifier 201b is defined by a digital-to-analog converter (DAC) 215. Similar to the DDR3 memory interface, the output of the differential amplifier 202b is shifted by 90 degrees. The shifted output of the differential amplifier 202b and the output of the differential amplifier 201b are provided to a sampler 205b. The sampler 205b is configured to sample the output of the differential amplifier 201b based on the shifted output of the differential amplifier 202b. The output of the sampler 205b is provided to the local memory controller 150.

Degradation in the performance of a memory interface, e.g., DDR I/O memory interface such as 110, may be due to a shift in the reference voltage $V_{ref}$ or amplifier offset. Amplifier offset within a differential amplifier, e.g., 101a, 101b, . . . , or 101h, results in an internal potential difference between the two input nodes of the differential amplifier even when the same voltage is applied to both nodes. The shift in the reference voltage and/or the amplifier offset within one or more differential amplifiers may be caused, for example, by Process-Voltage-Temperature (PVT) variation, design of the board on which the integrated circuit(s) (IC) resides, or other factors.

Figure 3:
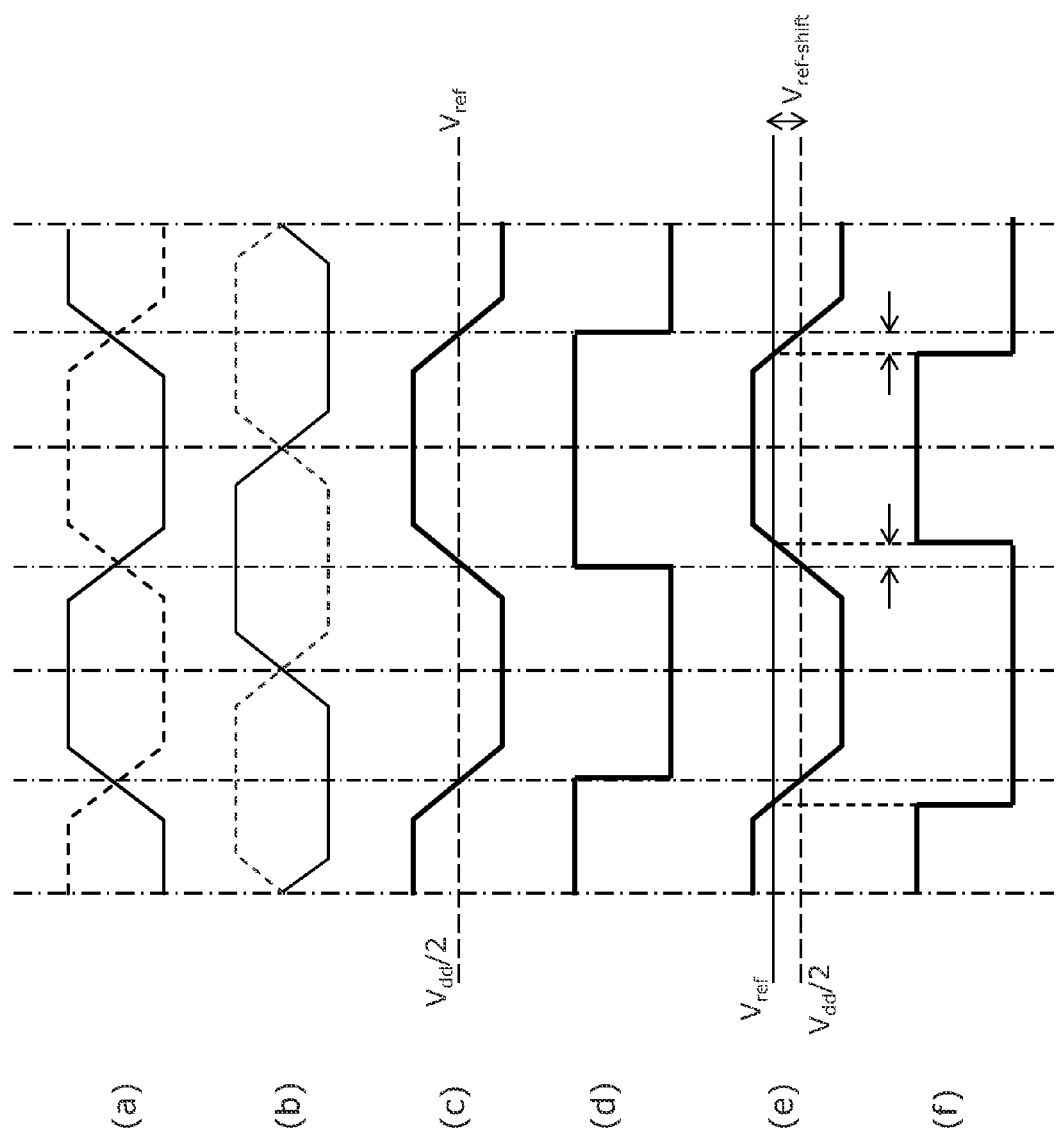
FIG. 3 is a set of plots illustrating the effect of a reference voltage shift on a corresponding DQ signal.

FIG. 3 is a set of plots illustrating the effect of a reference voltage shift on a corresponding DQ signal. Plot (a) shows DQS signals while plot (b) shows the same DQS signals shifted by 90 degrees. The plot (c) shows a DQ signal associated with the DQS signals in the plots (a) and (b). The DQ signal in plot (c) and the DQS signals shown in plot (a) are edge-aligned with each other. By shifting the DQS signals as shown in plot (b), the fall and rise phases of the shifted DQS signals become aligned with the middle of the pulse duration of the DQ signal in plot (c). The DQ signal in plot (c) has a reference voltage $V_{ref}$ equal to half of the corresponding supply voltage, i.e., $V_{dd}/2$, therefore resulting in equal pulse durations for distinct DQ pulses as shown in plot (d). Plot (e), however, shows a shift in the reference voltage equal to $V_{ref\text{-}shift}$ with respect to half the supply voltage, e.g., $V_{ref\text{-}shift} = V_{ref} - (V_{dd}/2)$. The shift in the reference voltage may result in non-equal pulse durations for distinct DQ pulses. A person skilled in the art should appreciate that an offset in internal amplifier voltage may lead to similar effects as the ones caused by a shift in the reference voltage but with relatively smaller range. That is, an offset in internal amplifier voltage may potentially cause non-uniform pulse duration across distinct DQ pulses, increased duty cycle distortion, and/or potentially higher sampling error rate by the sampler 150. However, the effects of an offset in internal amplifier voltage are typically less severe in magnitude than the effects of a shift in the reference voltage.

In typical memory interfaces, amplifier reference voltage is addressed through amplifier reference voltage calibration that is usually handled by the software of the microprocessor which causes the local memory controller 150 to take specific actions. Specifically, the software causes the LMC 150 to instruct the memory component 90 to send one or more patterns of DQ bits, e.g., eight bits, to the I/O memory interface 110 over a number of iterations. The corresponding outputs from the memory interface 110 are compared to expected data patterns and an estimate of the reference voltage is evaluated based on comparison results over the iterations. For an eight-bit reference voltage calibration, the number of iterations is equal to 256 iterations to cover the entire code range.

According to at least one example embodiment, a scheme of reference voltage calibration is performed within the I/O memory interface 110. According to at least one other example embodiment, a scheme of amplifier offset calibration is performed within the I/O memory interface 110. The reference voltage calibration process and the amplifier offset calibration process are not handled by the local memory controller 150. Specifically, the reference voltage calibration and/or the amplifier offset calibration may be triggered by the LMC 150, however, the calibration processes, e.g., adjustment of calibration parameters, are performed within the I/O interface 110 with no control interference from the LMC 150. According to further example embodiment(s) a two-phase amplifier calibration is performed. During a first phase, amplifier offset calibration is applied to each single ended receiver of the I/O memory interface 110. In a second stage, a reference voltage calibration is applied to at least one single-ended receiver of the I/O memory interface 110.

Figure 4A:
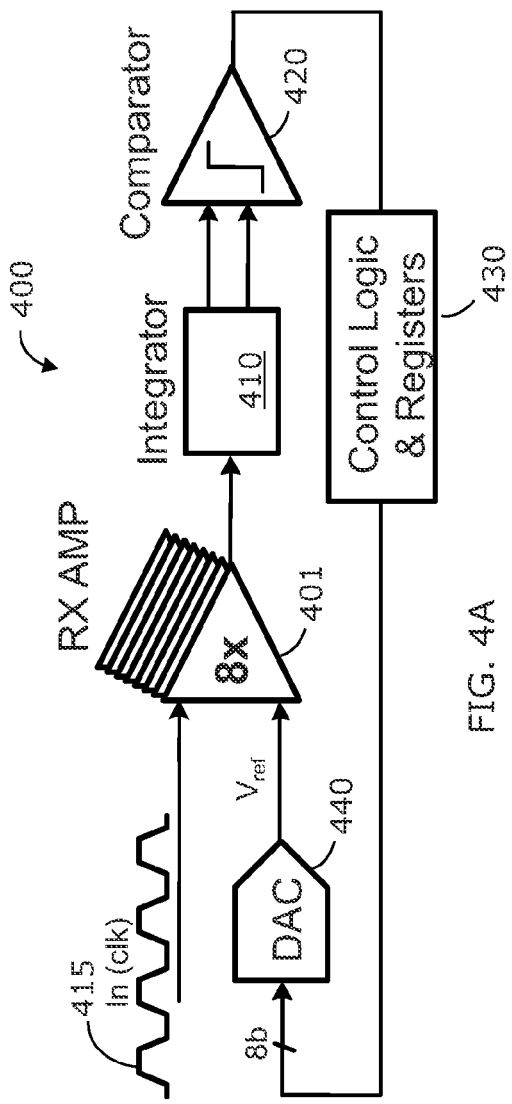
FIG. 4A is a diagram illustrating a system, or circuit, for reference voltage calibration.

FIG. 4A is a diagram illustrating a system, or circuit, 400 for reference voltage calibration. The system 400 includes a differential amplifier 401 of a single-input receiver, integrator circuit 410, comparator 420, control logic 430, and digital to analog converter (DAC) 440. The DAC 440 converts a digital value into an analog voltage value that is applied to the differential amplifier 401 as a reference voltage. The digital value, e.g., an eight-bit digital value, is provided by the control logic 430. A clock signal 415 is applied to the differential amplifier 401 as a second input besides the reference voltage. The output of the differential amplifier is fed to the integrator circuit 410. The integrator circuit 410 is configured to provide one or more values indicative of the duty cycle associated with the output signal of the differential amplifier 401.

According to an example implementation, the integrator circuit 410 may generate two signals from the output signal of the differential amplifier 401; a first generated signal consisting of high-voltage pulses of the amplifier's output signal, and a second generated signal consisting of low-voltage pulses of the amplifier's output signal. The integrator circuit 410 then integrates each of the generated signals over a time interval and provides two corresponding integral values to the comparator 420. The comparator compares the two values and provides an indication of the result of comparison to the control logic 430. Alternatively, the integrator may compute an estimate of the duty cycle based on the computed integral values and provide the duty cycle estimate result to the comparator 420. The comparator then compares the estimated duty cycle to a reference duty cycle value, e.g., 50%, and provides the result of the comparison to the control logic 430. The control logic 430 is a hardware logic, or logic circuit.

According to another example implementation, the integrator circuit 410 may simply integrate the amplifier's output signal over a period of time equal to a number of clock cycles, and provide an indication of the integration result to the comparator 420. The comparator 420 compares the indication of the integration result to zero or to its inverted value, and provides an indication of the comparison result to the control logic 430.

Based on the received indication of the comparison result, the control logic 430 is configured to determine whether the reference voltage is to be increased or decreased. For example, an indication that the duty cycle is less than 50%, e.g., the duration of a high voltage pulse is smaller than the duration of a low voltage pulse in the output signal from the differential amplifier, suggests that there is a positive shift in the reference voltage and that the reference voltage needs to be decreased. However, an indication that the duty cycle is greater than 50% suggests that there is a negative shift in the reference voltage and that the reference voltage is to be increased. Based on the determined type of shift in the reference voltage, e.g., positive or negative, the control logic 430 updates the digital value representing the reference voltage and provides the updated digital value to the DAC 440. The DAC 440 converts the digital value to an analog DC voltage. The DC voltage is fed to the differential amplifier 401 as an updated reference voltage. Such process is repeated for a number of iterations before reaching a final value of the reference voltage.

Figure 4B:
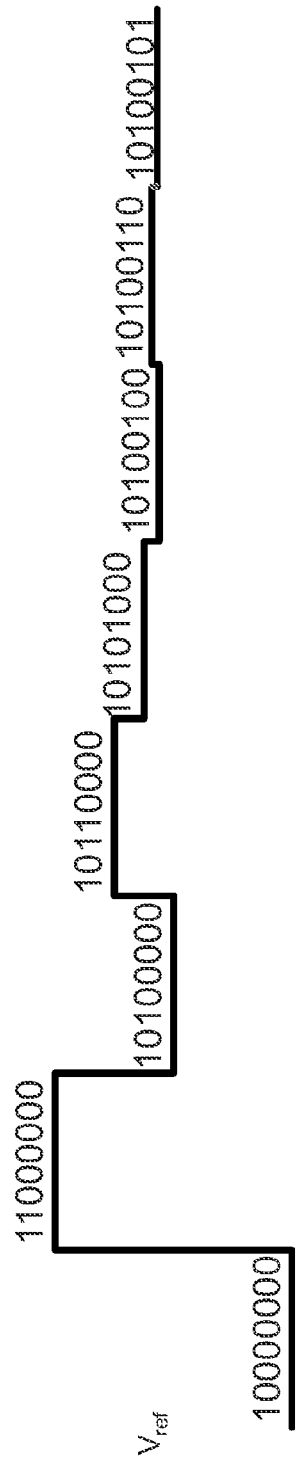
FIG. 4B is a diagram illustrating an example scheme of updating the input of the digital-to-analog converter as part of reference voltage calibration, according to at least one example embodiment.

FIG. 4B is a diagram illustrating an example scheme of updating the input of the digital-to-analog converter 440 as part of reference voltage calibration, according to at least one example embodiment. The control logic 440 applies a binary, or half-interval, search. Assuming that the digital value is an eight-bit number, the control logic 430 starts with the binary number 10000000, or 128, to initialize the digital value. When applying the reference voltage corresponding to the initial digital value, the control logic 430 detects that the duty cycle is greater than 50%, and increases the digital value to 11000000. With the new digital value, the duty cycle is determined to be less than 50% and the digital value is decreased to 10100000. The process continues until a final value of the digital value, e.g., 10100101, is achieved after seven iterations. In general, if the number of bits representing the digital value is n, the binary search algorithm takes only n−1 iterations to achieve a final result.

Figure 5:
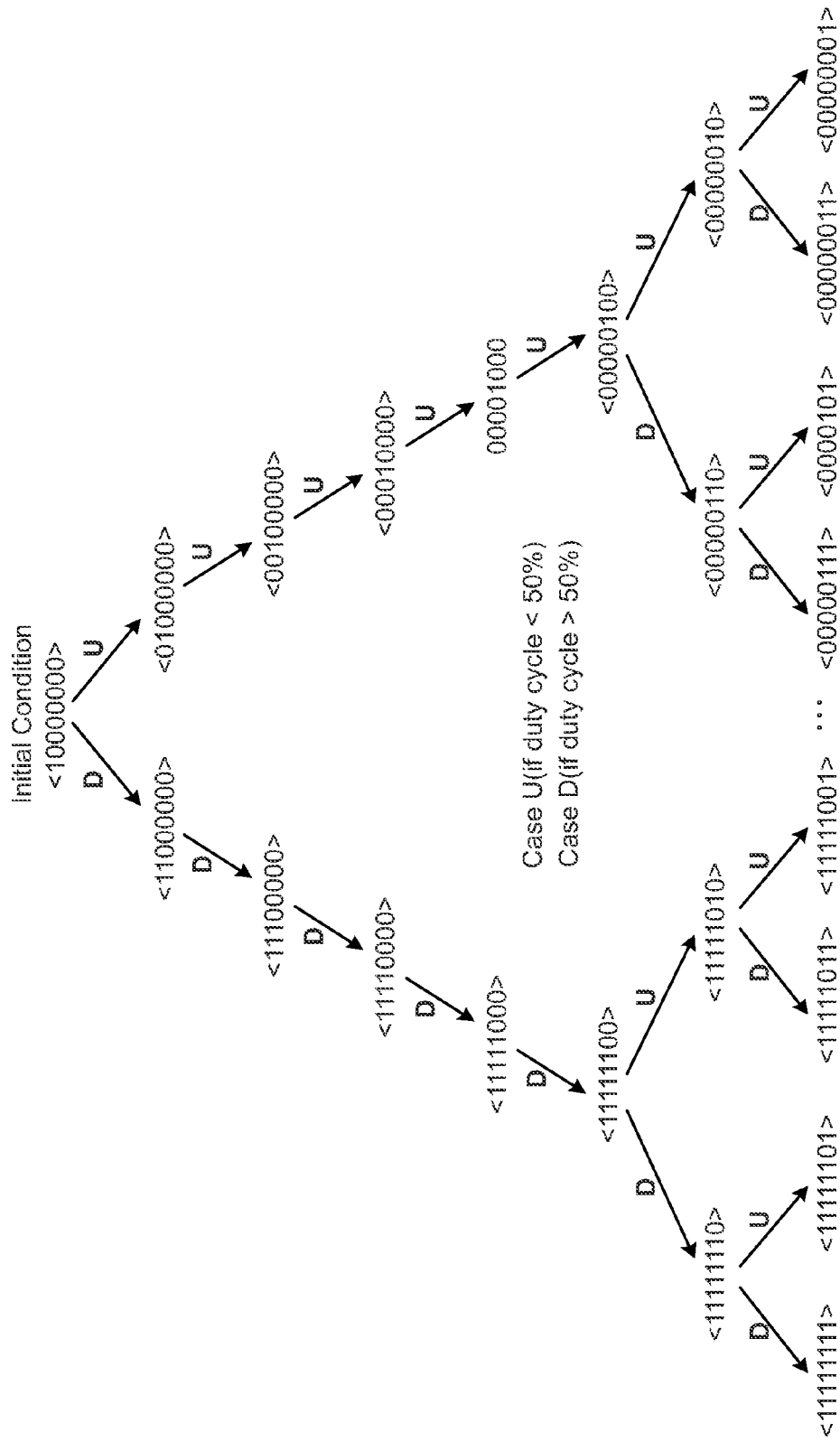
FIG. 5 is a tree illustrating an algorithm for adapting the input of the digital-to-analog converter as part of reference voltage calibration, according to at least one example embodiment.

FIG. 5 is a tree graph illustrating an algorithm for adapting the input of the digital-to-analog converter in reference voltage calibration, according to at least one example embodiment. In the tree graph shown in FIG. 5, only eight paths out of a total of 128 potential paths of the binary search algorithm for an eight-bit binary number are shown. Each node of the tree represents a digital value indicative of a corresponding analog reference voltage value. Each edge in the tree is either marked with "U," indicating that a current reference voltage value suggests a shift up, or positive shift, and that the reference voltage value is to be decreased in the next iteration, or marked with "D," indicating a down shift, or negative shift, of the current reference voltage and that the current reference voltage value is to be decreased.

A person skilled in the art should appreciate that a reference duty cycle value other than 50% may also be used, e.g., if the clock signal 415 fed to the differential amplifier has a duty cycle different from 50%. In other words, the reference duty cycle value considered when performing the comparison at the comparator 420 is equal to the duty cycle of the clock signal 415. Also, it should be appreciated that reference voltage calibration is applied to at least one single-ended receiver among the multiple single ended receivers, for example, within the I/O memory interface 110. For example, reference voltage calibration may be applied to one single-ended receiver. At the end of the reference voltage calibration process, the final reference voltage is applied to all differential amplifiers, e.g., 101a-101h, associated with multiple single-ended receivers within the I/O memory interface 110.

Figure 6A:
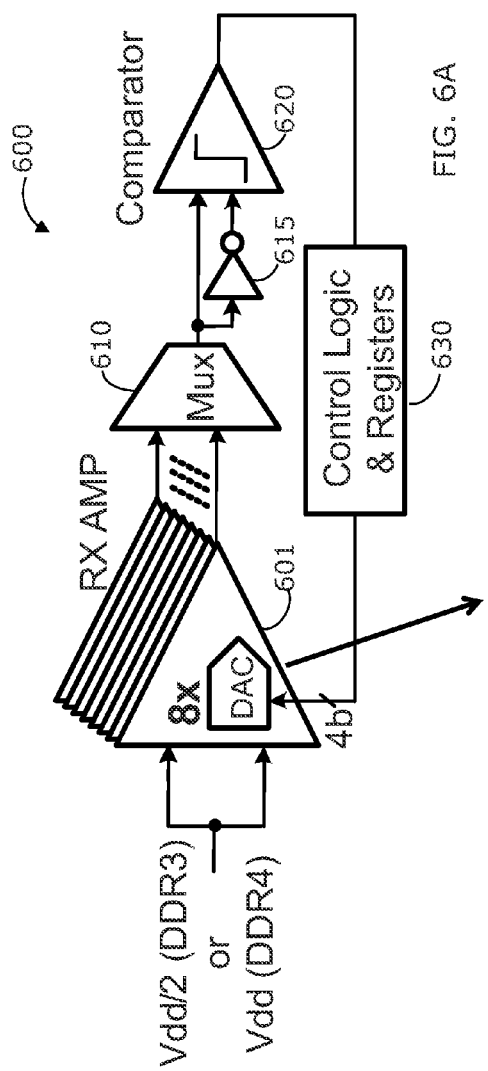
FIG. 6A is a diagram illustrating a system, or circuit, for amplifier offset calibration.

FIG. 6A is a diagram illustrating a system, or circuit, 600 for amplifier offset calibration. The system 600 includes multiple differential amplifiers 601 associated with multiple single-input receivers. According to at least one example embodiment, amplifier offset calibration is applied to each amplifier of the multiple single-ended receivers within the I/O memory interface 110. For each differential amplifier associated with a corresponding single-ended receiver, the same DC voltage is applied to both input nodes of the differential amplifier during the process of amplifier offset calibration. The system 600 also includes at least one multiplexer 610 and a comparator 620. According to at least one example implementation, outputs from multiple differential amplifiers 601 are multiplexed serially by the multiplexer 610. Each output is then inverted by an inverter 615, and both the output and its inverted value are passed to the comparator 420. The comparator 420 compares both values and provides an indication of the comparison result to control logic 630. The control logic 630 is hardware logic, or logic circuit, and is configured to update a digital value for sending to a DAC within a differential amplifier 601 based on the comparison result. The DAC is within the differential amplifier 601 whose output is used to generate the indication of the comparison result. In other words, given an indication of the result of comparison corresponding to a given differential amplifier 601, the control logic 630 determines whether a digital input value, associated with a DAC within the same differential amplifier 601, is to be increased or decreased based on the indication of the comparison result received from the comparator 620. The control logic 630 then sends an updated value of the input digital value to the DAC with the differential amplifier 601. The process of using the output of the differential amplifier 601 to update the input digital value associated with a DAC within the same differential amplifier 601 is repeated for a number of iterations.

Figure 6B:
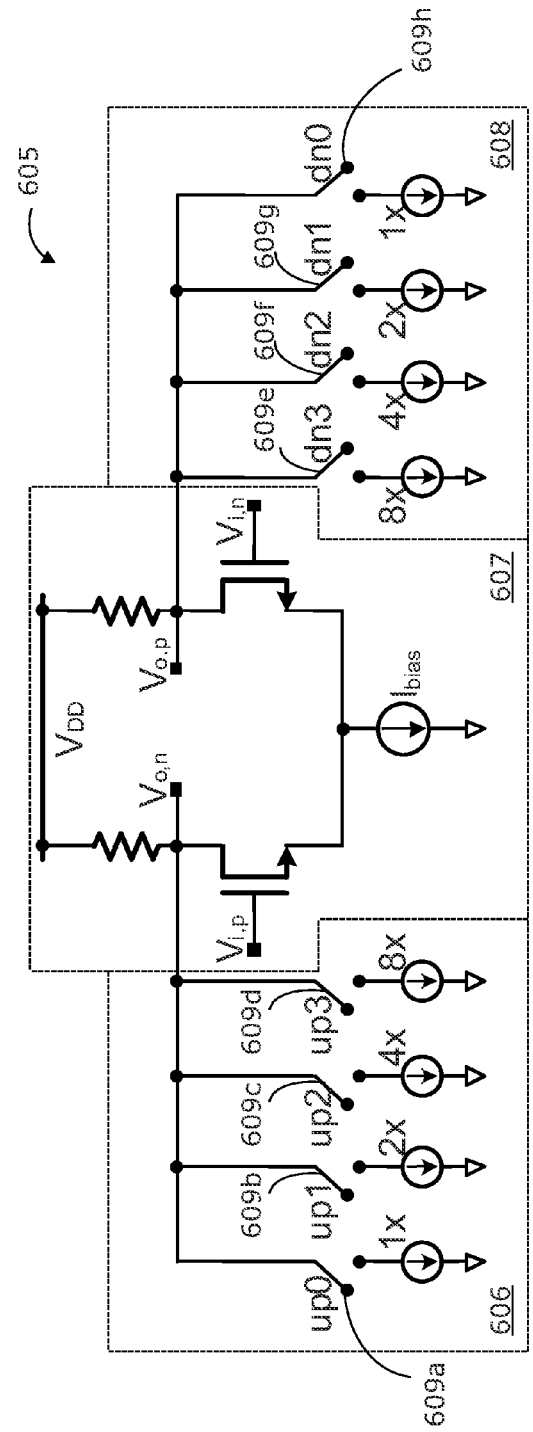
FIG. 6B shows a circuit of two digital-to-analog converters coupled to a gain stage of a differential amplifier, according to at least one example implementation.

FIG. 6B shows a circuit 605 of two digital-to-analog converters coupled to a gain stage of a differential amplifier 601, according to at least one example implementation. According to the example implementation shown in FIG. 6B, each DAC is a four-bit DAC. A first DAC 606 is coupled to one side of the second stage gain 607 of the differential amplifier 601, and a second DAC 608 is coupled to a second side of the second stage gain 607 of the differential amplifier 601. By updating the digital input value of a DAC, e.g., 606 or 608, the control logic 630 is configuring the switches, e.g., 609a-609d or 609e-609h, associated with the same DAC.

A person skilled in the art should appreciate that one or more DACs, within a given differential amplifier 601, may be configured by the control logic 630. For example, assuming that the differential amplifier has a number of gain stages. The one or more DACs may be arranged in a way to be coupled to any of the gain stages of the differential amplifier 601. For example, a total of two DACs may be configured by the control logic 630. The two DACs may be both coupled the second gain stage of the differential amplifier, as shown in FIG. 6B, or any other gain stage of the differential amplifier. Alternatively, each DAC may be couple to a distinct gain stage. According to another example implementation, more than two DACs may be configured by the control logic 630. In such case different coupling patterns between the two or more DACs and gain stages of the differential amplifier 601 may also be considered. According to yet another example implementation, only a single DAC, coupled to a gain stage of the differential amplifier 601, may be configured by the control logic.

Figure 7:
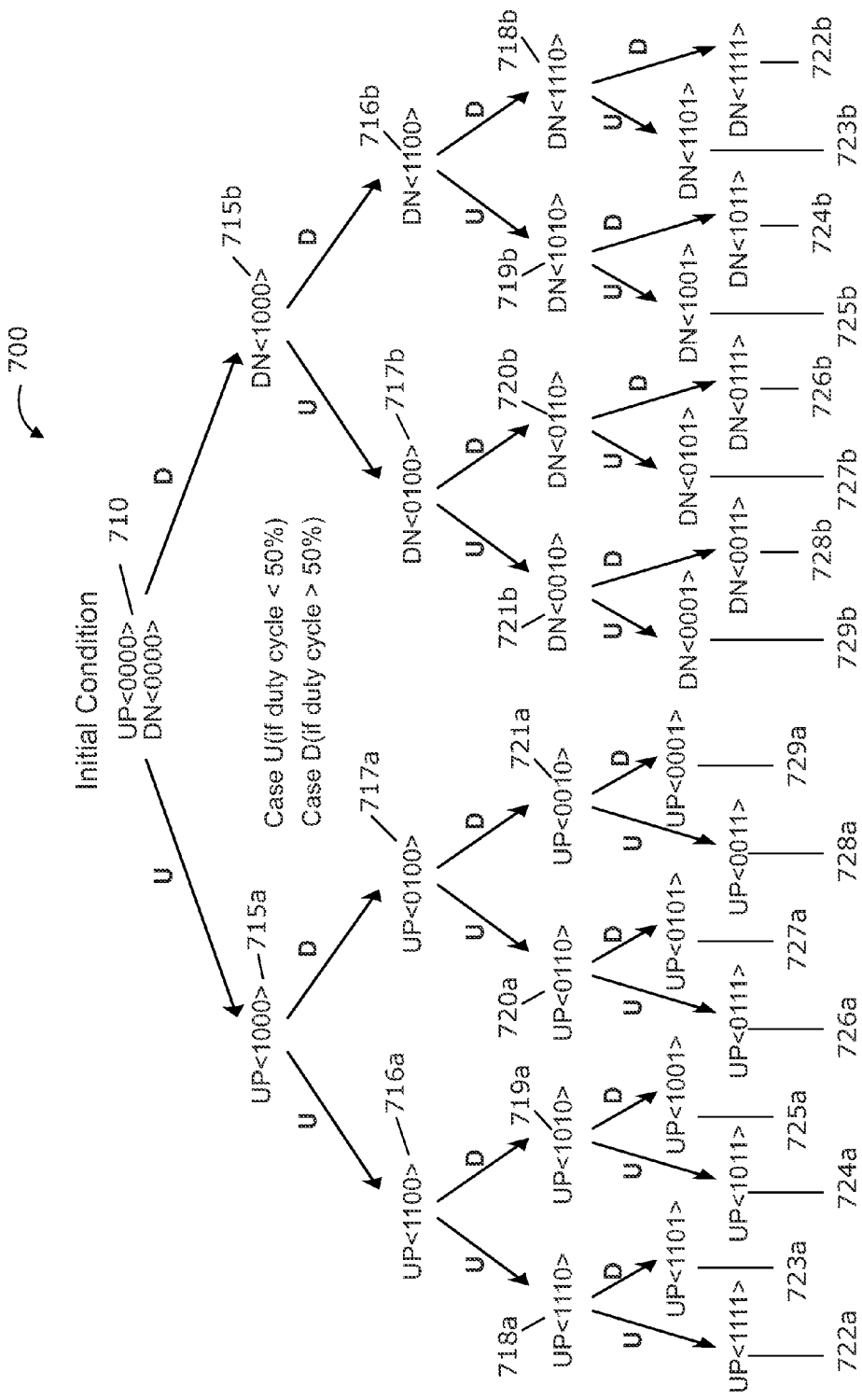
FIG. 7 is a tree illustrating a scheme according to which a digital input for a DAC, within a differential amplifier of a single-ended receiver, is iteratively updated, according to at least one example embodiment.

FIG. 7 is a tree 700 illustrating a scheme according to which a digital input for a DAC, within a differential amplifier 601 of a single-ended receiver, is iteratively updated, according to at least one example embodiment. The tree 700 corresponds to a scenario where two DACs, e.g., as shown in FIG. 6B, are configurable by the control logic 630. Initially, e.g., at the first iteration, the digital value associated with each of the DACs is initialized to 0000. Upon receiving an indication of the comparison result associated with the output of the differential amplifier 601, the control logic determines which DAC is to be configured based on the received indication.

For example, if it is determined that the differential amplifier 601 has a negative voltage offset initially, e.g., the output of the differential amplifier 601 is negative, and the output voltage is to be increased, the DAC 606 in FIG. 6B is the one selected for configuration. Specifically the digital input value applied to DAC 606 is updated to be 1000 while the digital input value applied to the DAC 608 is kept 0000. The selection of the DAC 606 is illustrated in the tree 700 by the node 715a. However, if it is determined that the differential amplifier 601 has a positive voltage offset initially, e.g., the output of the differential amplifier 601 is positive, and the output voltage is to be decreased, the DAC 608 in FIG. 6B is the one selected for configuration. The digital input value applied to DAC 608 is updated to be 1000 while the digital input value applied to the DAC 606 is kept 0000. The selection of the DAC 608 is illustrated in the tree 700 by the node 715b.

Once a DAC is selected, the digital input value for the selected DAC is updated in the following iterations. For example, the digital input value for the selected DAC is updated according to a binary, or half-interval, search algorithm as illustrated in the tree 700. In other words, at each iteration, the digital input value is updated by a half of an interval representing a range of update values. In the tree 700, an edge marked as "U" indicates an update towards increasing the offset voltage, and an edge marked as "D" indicates an update towards decreasing the offset voltage of the differential amplifier 601. A person skilled in the art should appreciate that the updating of the digital input value may be performed according to a different scheme other than the binary search approach.

Figure 8:
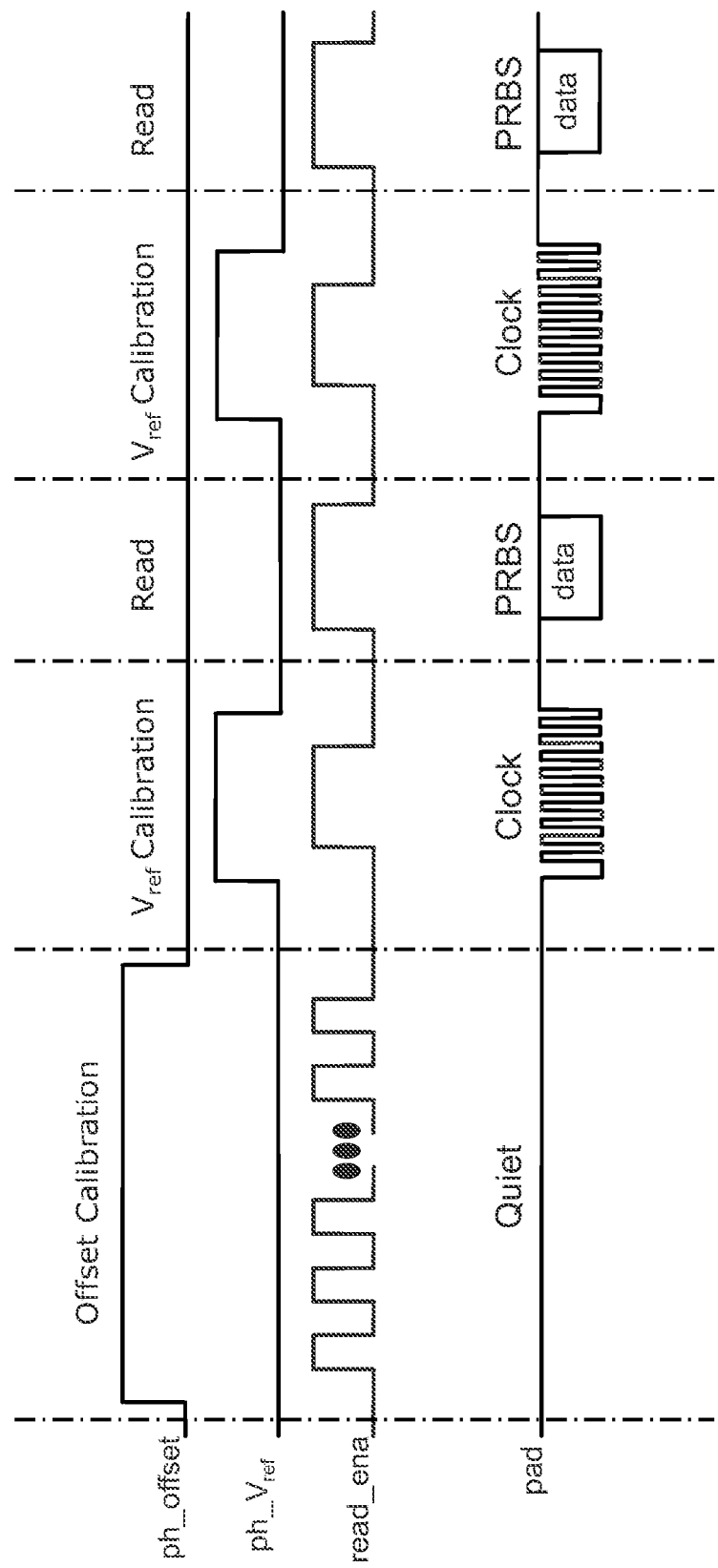
FIG. 8 shows a set of plots illustrating different operation phases of a differential amplifier of a single-ended receiver, according to at least one example embodiment.

FIG. 8 shows a set of plots illustrating different operation phases of a differential amplifier 601 of a single-ended receiver, according to at least one example embodiment. According to at least one example embodiment, the offset calibration is performed when power is turned on, as shown by the offset phase plot "ph_offset," so that offset of each receiver amplifier due to the non-uniformity and PVT variation is compensated. Offset calibration is performed to each differential amplifier of a single-ended receiver within the I/O memory interface 110. Once amplifier offset calibration is completed, reference voltage calibration is performed, as shown in the reference voltage calibration phase plot "ph_$V_{ref}$" for at least one single-ended receiver, e.g., within the I/O memory interface 110. Upon completion of the reference voltage calibration, the final reference voltage is applied, e.g., to all differential amplifiers associated with single-ended receivers within the I/O memory interface 110. After reference voltage calibration is complete, data read operations are performed. According to at least one example implementation, the reference voltage calibration process may be repeated during idle phases of the single-ended receivers. Also, during offset calibration, the enable read signal "ena_read" may be employed as the clock signal fed to control logic 630 and comparator 620.

A person skilled in the art should appreciate that embodiment of the amplifier offset calibration and the reference voltage calibration described above may also be applied in I/O interfaces that are not memory interfaces.

Figure 9:
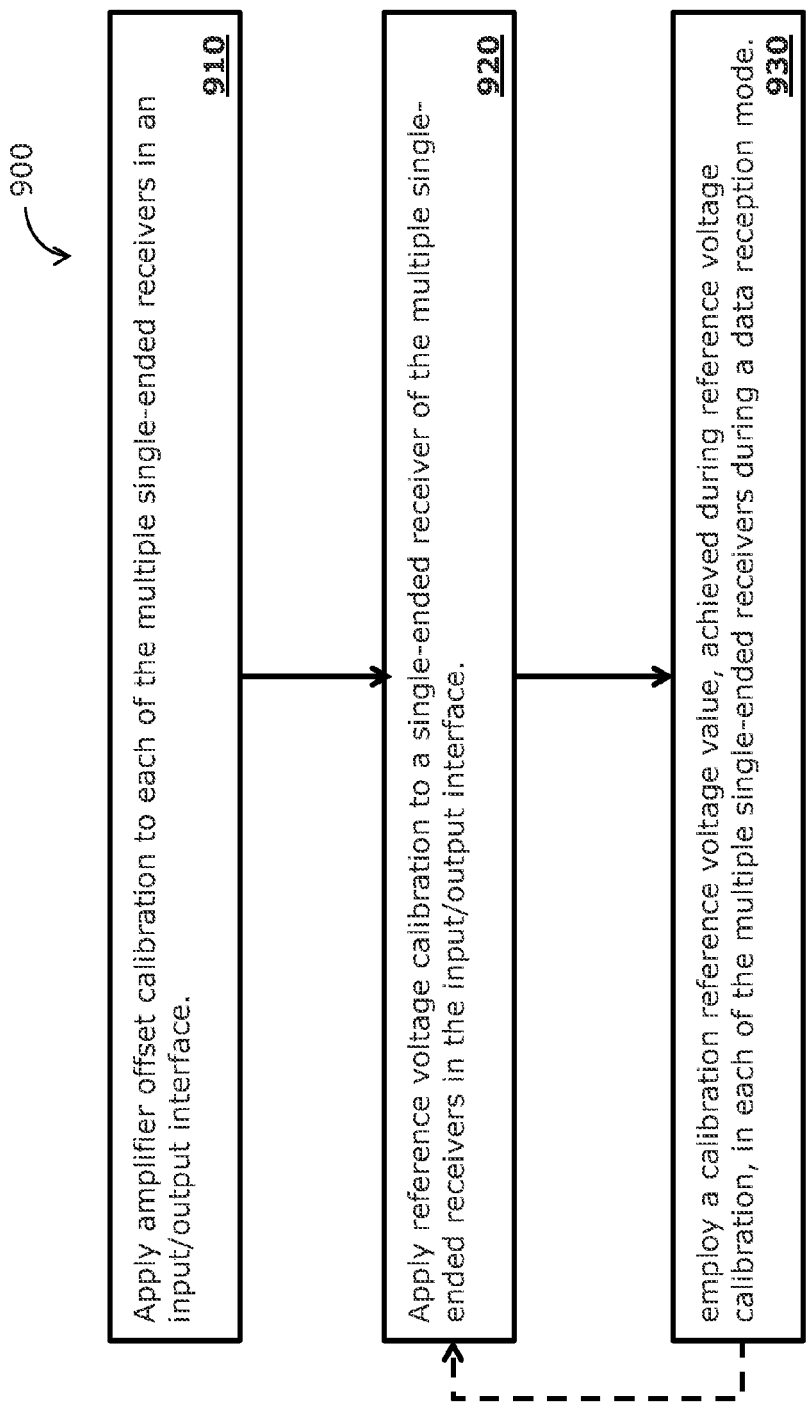
FIG. 9 is a flowchart illustrating a method of calibrating an input interface having multiple single-ended receivers, according to at least one example embodiment.

FIG. 9 is a flowchart illustrating a method 900 of calibrating an I/O interface having multiple single-ended receivers, according to at least one example embodiment. At block 910, amplifier offset calibration is applied to each of the multiple single-ended receivers in the I/O interface. The amplifier offset calibration is achieved through an iterative approach as described with respect to FIGS. 6A, 6B, and 7. Specifically, the same DC voltage is applied to both inputs of the differential amplifier of each single-ended receiver. Based on the sign of the output, a control logic 630 configures switches associated with a DAC within the differential amplifier. Configuring the switches of the DAC is achieved by updating a digital value provided as input to the DAC. According to an example embodiment, more than one DACs within each differential amplifier may be configurable by the control logic 630. For example, in a first iteration, the control logic determines one of the DACs to be configured. In the following iterations, a digital value provided as input to the DAC determined is updated.

Once amplifier offset calibration is complete, reference voltage calibration is applied, at block 920, to at least one single-ended receiver of the multiple single-ended receivers to determine a calibration reference voltage value. Reference voltage calibration is performed iteratively as illustrated above in the description of FIGS. 4A, 4B, and 5. In other words, a DC voltage signal and a clock signal are applied as inputs to the differential amplifier of the single-ended receiver. The output of the differential amplifier is analyzed to determine an indication of the corresponding duty cycle, e.g., greater or less, than a reference value. Based on the determined indication of the duty cycle, a control logic 430 updates a digital value provided as input a DAC 440. The digital value represents an updated value of the reference voltage level, and is converted to an analog DC voltage by the DAC 440. The DC voltage is applied as the reference voltage to the differential amplifier. The analyzing and updating process is repeated over a number of iterations, e.g., equal to the number of bits representing the digital number minus one, and a final reference voltage level is achieved at the last iteration.

At block 930, the final reference voltage level is applied within each of the multiple single-ended receivers during a data reception mode. According to an example implementation, the reference voltage calibration may be repeated at a later time during an idle mode of the input/output interface. The amplifier offset calibration is performed after starting the chip associated with the input/output interface.

A person skilled in the art should appreciate that the amplifier offset calibration and the reference voltage calibration embodiments described above may also be applied in systems/circuits other than input/output interfaces and memory interfaces.

While this invention has been particularly shown and described with references to example embodiments thereof, it will be understood by those skilled in the art that various changes in form and details may be made therein without departing from the scope of the invention encompassed by the appended claims.

What is claimed is:

1. A method of calibrating a reference voltage of a single-ended receiver, the method comprising:
applying a clock signal and a reference voltage signal as inputs to a differential amplifier of the single-ended receiver;
evaluating an indication of a duty cycle associated with an output signal of the differential amplifier;
adjusting, by control logic configured to apply a binary search, a level of the reference voltage signal based on the evaluated indication of the duty cycle; and
repeating said evaluating and said adjusting over a number of iterations.

2. The method as recited in claim 1 further comprising employing a final level of the reference voltage signal associated with a final iteration in the single-ended receiver during a data reception phase.

3. The method as recited in claim 1, wherein evaluating the indication of the duty cycle includes:
splitting the output signal of the differential amplifier into two separate output signals;
integrating each of the output signals over a time interval resulting in two integration values; and
comparing the two integration values.

4. The method as recited in claim 3, wherein the time interval is equal to multiple clock cycles associated with the clock signal.

5. The method as recited in claim 1, wherein evaluating the indication of the duty cycle includes:
integrating the output of the differential amplifier over a time interval resulting in an integration value; and
comparing the integration value to a reference duty cycle value.

6. The method as recited in claim 5, wherein the time interval is equal to multiple clock cycles associated with the clock signal.

7. The method as recited in claim 1, wherein adjusting the level of reference voltage signal includes setting, by the control logic, a digital-to-analog (DA) converter, the DA converter providing a reference voltage level value to the differential amplifier.

8. The method as recited in claim 7, wherein the reference voltage level value provided by the DA converter is represented by multiple bits.

9. The method as recited in claim 7, wherein the number of iterations is equal to the number of bits representing the reference voltage level value minus one.

10. The method as recited in claim 1, wherein the single-ended receiver is included in an input/output interface having multiple single-ended receivers, the method being applied to at least one of the multiple single-ended receivers.

11. The method as recited in claim 10, wherein the input/output interface is associated with a memory interface, the memory interface is:
a double data rate 2 (DDR2) memory interface;
a double data rate 3 (DDR3) memory interface;
a double data rate 4 (DDR4) memory interface;
a low power double data rate 2 (LP DDR2) memory interface;
a low power double data rate 3 (LP DDR3) memory interface;
a low power double data rate 4 (LP DDR4) memory interface;
a graphical double data rate 3 (GDDR3) memory interface;
a graphical double data rate 4 (GDDR4) memory interface;
a graphical double data rate 5 (GDDR5) memory interface;
a wide input/output (Wide I/O) memory interface; or
a wide input/output 2 (Wide I/O 2) memory interface.

12. A system for calibrating a reference voltage associated with a single-ended receiver, the system comprising:
a differential amplifier of the single-ended receiver, the differential amplifier being configured to provide an output signal in response to a clock signal and a reference voltage signal being applied as inputs to the differential amplifier; and a control logic configured to apply a binary search to adjust, for a number of iterations, a level of the reference voltage signal based on an evaluated indication of a duty cycle associated with the output signal.

13. The system as recited in claim 12, wherein a final level of the reference voltage signal associated with a final iteration is applied to the differential amplifier during a data reception phase.

14. The system as recited in claim 12 further comprising:
an integrator configured to integrate two output signals, derived from the output of the differential amplifier, over a time interval resulting in two integration values; and a comparator configured to compare the two integration values, the control logic being configured to use the result of comparing the integration values in adjusting the level of the reference voltage signal.

15. The system as recited in claim 14, wherein the time interval is equal to multiple clock cycles associated with the clock signal.

16. The system as recited in claim 12 further comprising:
an integrator configured to integrate the output of the differential amplifier over a time interval resulting into an integration value; and a comparator configured to compare the integration value to a reference duty cycle value, the control logic being configured to use the result of comparing the integration value to the reference duty cycle value in adjusting the reference voltage.

17. The system as recited in claim 16, wherein the time interval is equal to multiple clock cycles associated with the clock signal.

18. The system as recited in claim 12 further comprising a digital-to-analog (DA) converter providing a reference voltage level value to the differential amplifier, wherein in adjusting the level of the reference voltage, the control logic is further configured to send a digital value to the DA converter representative of the reference voltage level value.

19. The system as recited in claim 18, wherein the digital value sent to the DA converter is represented using multiple bits.

20. The system as recited in claim 18, wherein the number of iterations is equal to the number of bits representing the digital value minus one.

21. The system as recited in claim 12, wherein the single-ended receiver is included in an input/output interface having multiple single-ended receivers, the control logic being configured to adjust the level of the reference voltage signal for at least one of the multiple single-ended receivers.

22. The system as recited in claim 21, wherein the input/output interface is associated with a memory interface, the memory interface is:
a double data rate 2 (DDR2) memory interface;
a double data rate 3 (DDR3) memory interface;
a double data rate 4 (DDR4) memory interface;
a low power double data rate 2 (LP DDR2) memory interface;
a low power double data rate 3 (LP DDR3) memory interface;
a low power double data rate 4 (LP DDR4) memory interface;
a graphical double data rate 3 (GDDR3) memory interface;
a graphical double data rate 4 (GDDR4) memory interface;
a graphical double data rate 5 (GDDR5) memory interface;
a wide input/output (Wide I/O) memory interface; or
a wide input/output 2 (Wide I/O 2) memory interface.

* * * * *